(12) United States Patent
Glass

(10) Patent No.: US 12,183,609 B2
(45) Date of Patent: Dec. 31, 2024

(54) WAFER CARRIER WITH RETICLE TEMPLATE FOR MARKING RETICLE FIELDS ON A SEMICONDUCTOR WAFER

(71) Applicant: Micron Technology, Inc., Boise, ID (US)

(72) Inventor: Gabe Glass, Salt Lake City, UT (US)

(73) Assignee: Micron Technology, Inc., Boise, ID (US)

( * ) Notice: Subject to any disclaimer, the term of this patent is extended or adjusted under 35 U.S.C. 154(b) by 252 days.

(21) Appl. No.: 17/686,205

(22) Filed: Mar. 3, 2022

(65) Prior Publication Data

US 2023/0282502 A1    Sep. 7, 2023

(51) Int. Cl.
*G03F 1/44*    (2012.01)
*H01L 21/673*   (2006.01)

(52) U.S. Cl.
CPC .......... *H01L 21/67346* (2013.01); *G03F 1/44* (2013.01)

(58) Field of Classification Search
None
See application file for complete search history.

(56) References Cited

U.S. PATENT DOCUMENTS

| | | | | |
|---|---|---|---|---|
| 4,343,877 A | * | 8/1982 | Chiang | H01L 27/0207 430/311 |
| 4,849,313 A | * | 7/1989 | Chapman | G03F 1/42 430/394 |
| 4,869,998 A | * | 9/1989 | Eccles | G03F 1/50 430/394 |
| 6,372,610 B1 | * | 4/2002 | Chang | H01L 21/26506 438/33 |
| 2003/0071329 A1 | * | 4/2003 | Cox | H01L 24/14 257/E23.179 |
| 2009/0045827 A1 | * | 2/2009 | Gangoso | G01R 1/07314 29/825 |
| 2010/0083899 A1 | * | 4/2010 | Hung | G03F 7/7035 118/713 |
| 2010/0233853 A1 | * | 9/2010 | Wakisaka | H01L 24/11 257/E21.599 |
| 2011/0316571 A1 | * | 12/2011 | Kiyokawa | G01R 31/2893 324/750.16 |
| 2014/0070374 A1 | * | 3/2014 | Numaguchi | H01L 21/0274 438/465 |

(Continued)

FOREIGN PATENT DOCUMENTS

| | | | | |
|---|---|---|---|---|
| JP | 57097626 A | * | 6/1982 | ............. H01L 21/30 |
| JP | 01112243 A | * | 4/1989 | |
| JP | 02236547 A | * | 9/1990 | ............... G03F 1/14 |

(Continued)

*Primary Examiner* — Martin J Angebranndt
(74) *Attorney, Agent, or Firm* — Perkins Coie LLP

(57) ABSTRACT

A wafer carrier assembly comprising a wafer carrier having a first and second side, the first side including: a circular recess configured to receive a semiconductor device wafer, and at least one cut-out arranged along the circumference of the circular recess. The first side also includes a carrier cover having a top and bottom side, the top side including: a plurality of gridlines extending to edges of the carrier cover, and a plurality of reticles extending from the top side to the bottom side where subsets of reticles are arranged to have a common center and each subset of reticles is arranged at each intersection of the plurality of gridlines.

22 Claims, 7 Drawing Sheets

(56) References Cited

U.S. PATENT DOCUMENTS

2015/0140784 A1* 5/2015 Sekiya ................ H01L 21/3081
                                                     438/462
2015/0380358 A1* 12/2015 Chang .................. H01L 23/544
                                                     414/800

FOREIGN PATENT DOCUMENTS

| JP | 10242032 | A | * | 9/1998 | |
| --- | --- | --- | --- | --- | --- |
| JP | 11097326 | A | * | 4/1999 | |
| JP | 11121563 | A | * | 4/1999 | |
| JP | 2006165359 | A | * | 6/2006 | |
| JP | 2011256409 | A | * | 12/2011 | |
| JP | 2013142777 | A | * | 7/2013 | |
| JP | 2014022395 | A | * | 2/2014 | |
| JP | 2018093127 | A | * | 6/2018 | |
| JP | 2020027922 | A | * | 2/2020 | |
| KR | 2006116491 | A | * | 11/2006 | ............... G03F 1/42 |
| TW | 201220379 | A | * | 5/2012 | |

* cited by examiner

WAFER CARRIER WITH RETICLE TEMPLATE FOR MARKING RETICLE FIELDS ON A SEMICONDUCTOR WAFER

TECHNICAL FIELD

The present disclosure relates to wafer carriers, and more particularly relates to a wafer carrier with reticle template for marking reticle fields on a semiconductor wafer.

BACKGROUND

Conventional semiconductor wafer carriers often serve as temporary holders of a semiconductor wafer allowing a technician or lab operator to mark areas of interest (e.g., outside field areas) for testing, exposure and developing or optical lithography. Since delicate surface coatings of the semiconductor wafer are exposed during the marking process, field areas are highly susceptible to contamination and damage (e.g., by touching, scratching, or erroneous markings) by the lab operator. Moreover, surface details are very difficult to see by the naked eye often requiring dark field light microscopy to find surface features or holding the semiconductor wafer and wafer carrier up at an angle from a light source to see reflected surface features. However, the above methods tend to be slow and time-consuming process and open the door for miscounting and incorrect marking because of the difficulties seeing surface details. Moreover, once a field area is detected and marked by a lab operator, other field areas of interest need to be counted in relation to the marked field area which leaves open the possibility of miscounting or another mistake in marking field areas. Thus, use of conventional semiconductor wafer carriers for marking and testing semiconductor wafer field areas is a costly, time consuming, and unreliable process that can damage semiconductor wafers and/or result in incorrect markings that cannot be relied on by lab operators.

Figure 1:
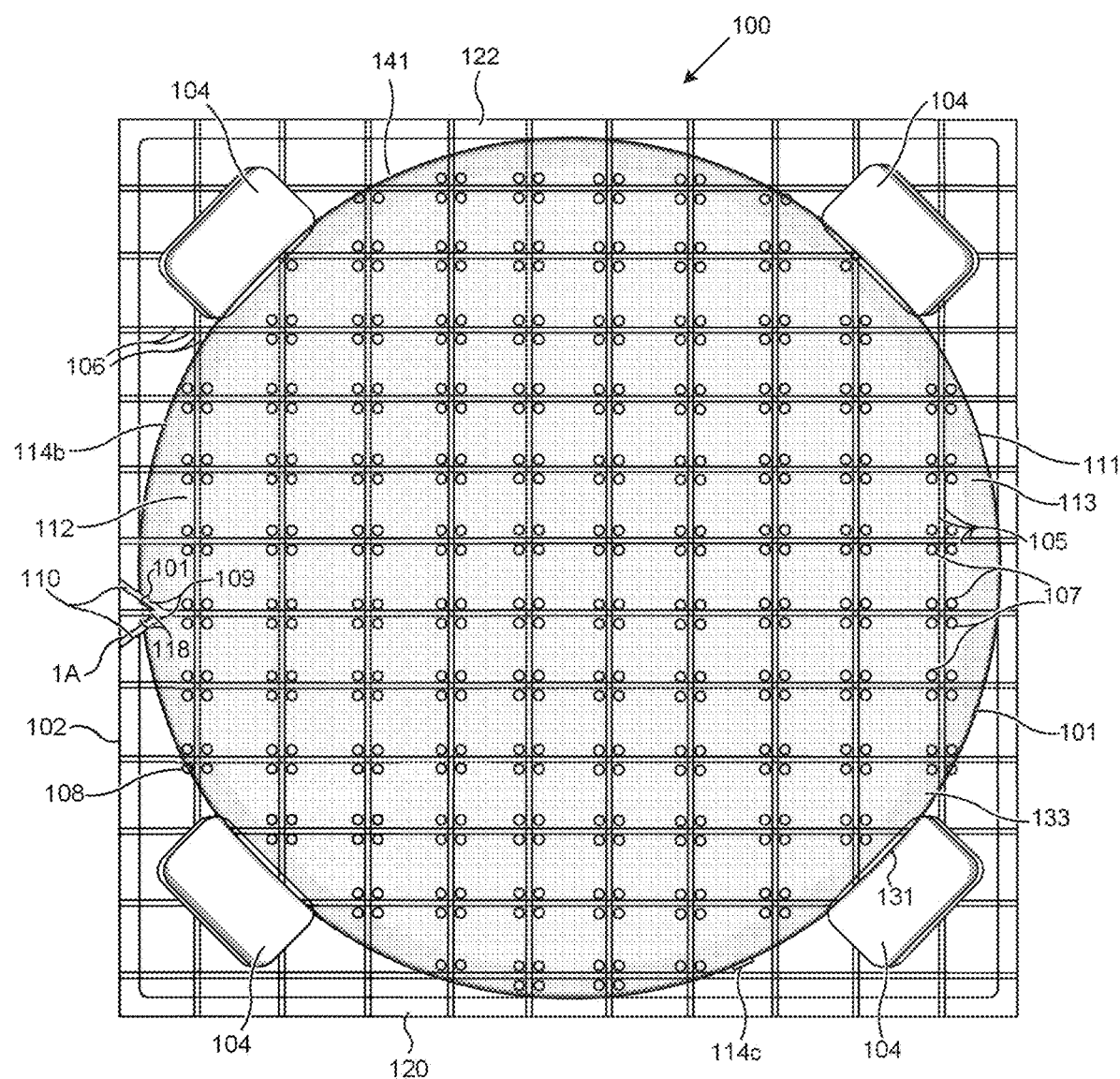
FIG. 1 is a plan view of an assembled exemplary reticle template wafer cover and wafer carrier in accordance with an exemplary embodiment of the present disclosure.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

Specific details of several embodiments of semiconductor devices, wafer carriers and wafer carrier covers and associated systems and methods, are described below.

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices, wafer carriers and wafer carrier covers may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As set forth above, conventional wafer carriers cannot be relied on for marking semiconductor wafer field areas for testing, exposure and developing or optical lithography. During the marking process, delicate surface coatings of the semiconductor wafer are exposed and easily scratched and damaged by hand contact or erroneous markings of a lab operator. Further, surface details are very difficult to see by the naked eye requiring additional equipment and time-consuming manual procedures opening the door to other errors such as miscounting and incorrect marking.

Embodiments of the present disclosure solve these problems and others by providing a transparent wafer cover having a reticle template and grid matching with field areas of a semiconductor wafer, such that when the semiconductor wafer is placed in a wafer carrier and covered and aligned with the grid of the wafer cover, the reticle template allows wafer field areas to be safely and reliably marked. As an example, the semiconductor wafer may be aligned with a notch in the wafer carrier, the wafer cover may be placed over the wafer, and the grid of the wafer cover may be rotated to align with the notch. Alternatively, the wafer carrier and cover may both have grids and/or notches that are aligned prior to aligning the semiconductor wafer. The semiconductor wafer may be rotated in place between the wafer cover and carrier until a field area, marking, or notch on the wafer is aligned with the grid and/or notch in the wafer carrier or cover. When wafer, carrier and cover are all aligned, markable regions of the wafer field areas align with the reticle template of the wafer cover allowing field areas to be marked through the reticle without contacting, touching, damaging, or contaminating the wafer. The wafer carrier may allow either semiconductor wafer or wafer cover to be rotated or adjusted while the semiconductor wafer is placed in the wafer carrier and protected underneath the wafer cover. Small adjustments may be made to either semiconductor wafer or wafer cover to correctly align field areas with the grid of the wafer cover, making counting specific areas on the semiconductor wafer faster, easier, and more reliable. The wafer cover and carrier prevent marking mistakes since the wafer cover reticle template can be clearly seen and the grid easily aligned with wafer field areas. The reticles and wafer cover provide a place to leave markers (e.g., tape, sharpie marks, etc.) for field areas of interest thereby speeding up the process of marking out multiple wafers. Once testing and lithography processes are completed, the marks can be safely and easily removed.

FIG. 1 is a plan view of an exemplary reticle template wafer cover and carrier in accordance with an exemplary embodiment of the present disclosure. As can be seen with reference to FIGS. 1, 2B and 2D, an exemplary wafer carrier 100 includes receiving tray 102 having a recess 112 for receiving a semiconductor wafer 141 and wafer cover 101 for further covering and protecting the semiconductor wafer 141 from damage and contamination. The receiving tray 102 includes an inner wall 214a formed adjacent to and along the circumference of recess 112. The inner wall 214a may be formed at an angle or perpendicular to the recess 112. In some embodiments, the circumference of the wafer cover 101 is greater than the circumference of the recess 112, in which case the wafer cover 101 rests on the top surface 222 of the receiving tray 102. In some embodiments, the circumference of the wafer cover 101 may be greater than the circumference of the recess 112 and the inner wall 214a may be at an angle to the recess 112 such that the wafer cover 101 rests between the recess 112 and top surface 222 of receiving tray 102. In some embodiments, the circumference of the wafer cover 101 may be less than the circumference of inner wall 214a, in which case the wafer cover 101 rests on the recess 112.

In some embodiments, top surface 122 may include one or more grooves or recesses 114b formed along a curve or circumference of the recess 112 to prevent wafer cover 101 from sliding or shifting while in place. In some embodiments, the recess 114b may be formed along a curve or circumference of inner wall 214a. In some embodiments, recess 114b may be formed on the top surface 222 and along a curve or circumference adjacent to recess 112. In some embodiments, top surface 122 may include one or more features or indentations 114c formed adjacent and along a curve or circumference of recess 112 to prevent wafer cover 101 from sliding or shifting while in place. In some embodiments, the receiving tray 102 may include a slanted inner wall 214a, one or more recesses 114b, one or more indentations 114c, or any combination thereof to prevent wafer cover 101 from sliding or shifting while in place.

The receiving tray 102 may include at least one cut-out 104. Each cut-out 104 may be positioned along, inside, or outside the circumference of recess 112. In some embodiments, cut-out 104 may cut into a curved portion of recess 112 and inner wall 214a to allow access to a lower surface 131 of the wafer cover 101. The cut-out 104 may be formed tangentially, parallel, or perpendicularly to the circumference of the recess 112. The cut-out 104 extends from the top surface 122 of receiving tray 102 and through the bottom surface 120. Each cut-out 104 may be the same or different in shape, for example, a square, rectangular, elliptical, or other polygonal shape.

The wafer cover 101 may include a textured surface feature 113 along the circumference of an upper surface 133 to facilitate ease in gripping or rotating the wafer cover 101. The textured surface feature 113 may be one or more regions along the circumference of the upper surface 133 that is grated, patterned, unpolished, rough, raised, or slanted. The textured surface feature 113 may be distributed on the upper surface 133 along one or more curved portions of the circumference of the wafer cover 101. In some embodiments, the textured surface feature 113 may completely cover the circumference of the wafer cover 101.

The wafer cover 101 may include a second textured surface feature 111 along the circumference of the lower surface 131 to facilitate ease in gripping or rotating the wafer cover 101. The second textured surface feature 111 may be one or more regions along the circumference of the lower surface 131 that is grated, patterned, unpolished, rough, raised, or slanted. The second textured surface feature 111 may be distributed on the lower surface 131 along one or more curved portions of the circumference of the wafer cover 101. In some embodiments, the second textured surface feature 111 may completely cover the circumference of the wafer cover 101.

The wafer cover 101 includes one or more grids or gridlines 105 and one or more reticles 107 formed on the upper surface 133. The reticles 107 may be grouped and centered about each intersection of the gridlines 105. The gridlines 105 indicate the field areas 243 of the semiconductor wafer 241, and the reticles 107 may be used to mark, label, or otherwise indicate a field area of interest on the semiconductor wafer 241.

The receiving tray 102 may also include one or more grids or gridlines 106 and one or more reticles 108 formed on the upper surface 122. The reticles 108 may be grouped and centered about each intersection of the gridlines 106. The gridlines 106 may be used to align with gridlines 105 of wafer cover 101. Further, the reticles 108 may be used to align with reticles 107 and/or gridlines 105 of wafer cover 101.

The receiving tray 102 and wafer cover 101 each include a portion of a notch 1A that may be used to align wafer cover 101 with receiving tray 102. In some embodiments, the receiving tray 102 includes a lower portion 110 and the wafer cover 101 includes an upper portion 109. When the lower portion 110 and upper portion 109 are aligned, the gridlines 106 and 108 of the receiving tray 102 and wafer cover 101 are also aligned. The notch 1A may be used to align the semiconductor wafer 141 with the wafer cover 101 by aligning notch 118 of semiconductor wafer 141 with notch 1A. In other embodiments, notch 1A may comprise of one portion formed only on the wafer cover for aligning notch 118 of semiconductor wafer 141 with notch 1A.

Figure 2A:
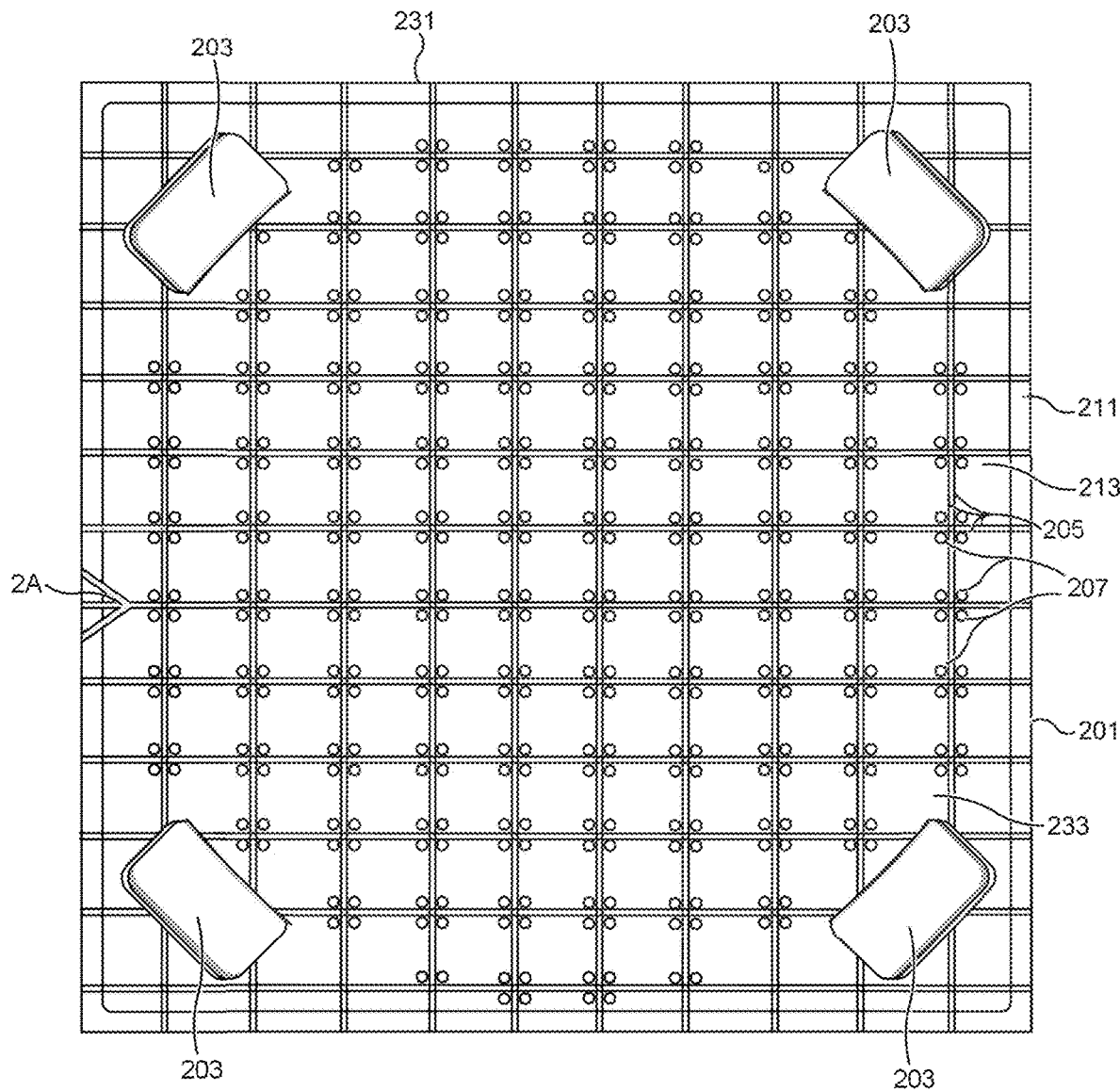
FIG. 2A is a plan view of an exemplary reticle template wafer cover for covering a wafer carrier in accordance with an exemplary embodiment of the present disclosure.

FIG. 2A is a plan view of an exemplary reticle template wafer cover for covering a wafer carrier in accordance with an exemplary embodiment of the present disclosure. As can be seen with reference to FIGS. 2A-2B, an exemplary wafer cover 201 includes one or more grids or gridlines 205 and one or more reticles 207 formed on the upper surface 233. The reticles 207 may be grouped and centered about each intersection of the gridlines 205. The gridlines 205 indicate the field areas 243 of the semiconductor wafer 241, and the reticles 207 may be used to mark, label, or otherwise indicate a field area of interest on the semiconductor wafer 241.

The wafer cover 201 includes a notch 2A that may be used to align the semiconductor wafer 241 with the wafer cover 201 by aligning an alignment mark 218 on semiconductor wafer 241 with notch 2A.

The wafer cover 201 may include a textured surface feature 213 along the circumference of an upper surface 233 to facilitate ease in gripping or rotating the wafer cover 201. The textured surface feature 213 may be one or more regions along the circumference of the upper surface 233 that is grated, patterned, unpolished, rough, raised, or slanted. The textured surface feature 213 may be distributed on the upper surface 233 along one or more curved portions of the circumference of the wafer cover 201. In some embodiments, the textured surface feature 213 may completely cover the circumference of the wafer cover 201.

The wafer cover 201 may include a second textured surface feature 211 along the circumference of the lower surface 231 to facilitate ease in gripping or rotating the wafer cover 201. The second textured surface feature 211 may be one or more regions along the circumference of the lower surface 231 that is grated, patterned, unpolished, rough, raised, or slanted. The second textured surface feature 211 may be distributed on the lower surface 231 along one or more curved portions of the circumference of the wafer cover 201. In some embodiments, the second textured surface feature 211 may completely cover the circumference of the wafer cover 201.

The wafer cover 201 may include at least one cut-out 203. Each cut-out 203 may align with the cut-out 204 of the receiving tray to allow access to the semiconductor wafer placed in recess 212. The cut-out 203 may be formed tangentially, parallel, or perpendicularly to the circumference of the recess 212. The cut-out 203 extends from the upper surface 233 of wafer cover 201 through the lower surface 231. Each cut-out 203 and/or 204 may be the same or different in shape, for example, a square, rectangular, elliptical, or other polygonal shape.

Figure 2B:
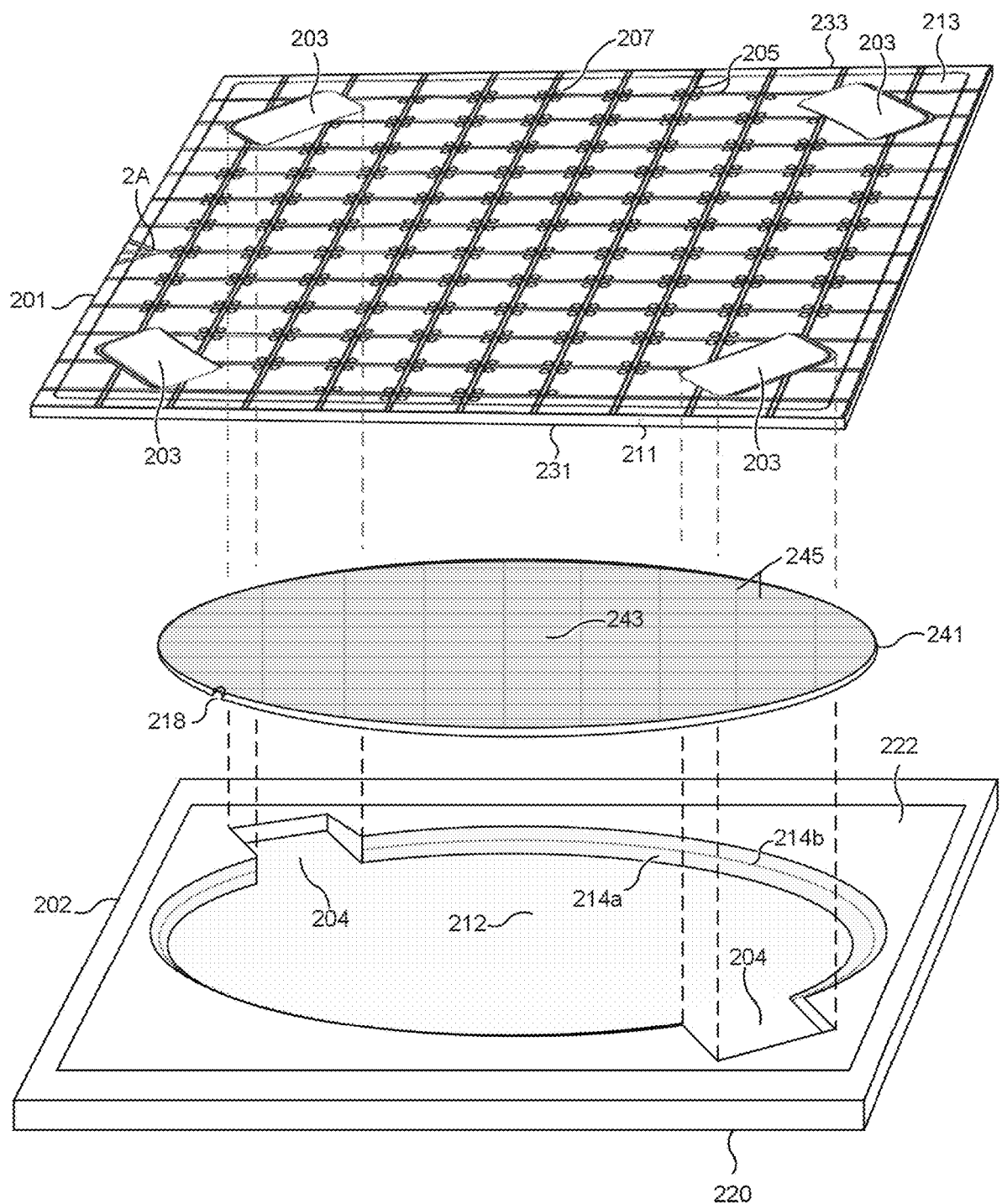
FIG. 2B is a perspective and simplified schematic cross-sectional view of the exemplary reticle template wafer cover of FIG. 2A for use with an exemplary wafer carrier and a semiconductor wafer in accordance with an exemplary embodiment of the present disclosure.

FIG. 2B is a perspective and simplified schematic cross-sectional view of the exemplary reticle template wafer cover of FIG. 2A for use with an exemplary wafer carrier and a semiconductor wafer in accordance with an exemplary embodiment of the present disclosure. As can be seen with reference to FIG. 2B, an exemplary semiconductor wafer 241 includes a plurality of field areas 243, each field area 243 have a plurality of field boundaries 245. The gridlines 205 and reticles 207 align with the field areas 243 and field boundaries 245 of the semiconductor wafer 241. The semiconductor wafer 241 may further include a notch 218 or flat cut (not shown). The wafer cover 201 includes a notch 2A formed on the upper surface 233 adjacent to an edge of the wafer cover 201. The notch 2A may be used to align the notch 218 or flat cut of the semiconductor wafer 241 such that gridlines 205 of wafer cover 201 align with field areas 243 and field boundaries 245 of semiconductor wafer 241.

Once the semiconductor wafer 241 is placed in the receiving tray 202, edges of the semiconductor wafer 241 are accessible through one or more cut-outs 203 of the wafer cover 201 and cut-outs 204 of the receiving tray 202. Each cut-out 203 allows access to an edge, an upper or lower surface of the semiconductor wafer 241 and/or the lower surface 231 (or second textured surface 211) of wafer cover 201. The semiconductor wafer 241 may be rotated by pressing or swiping an exposed edge of the semiconductor wafer 241 between cut-outs 203 and 204. The cut-out 203 may also be used to lift the semiconductor wafer 241, and pivot or slide the semiconductor wafer 241 in place over the recess 212. The cut-outs 203 and 204 may also be used to lift the wafer cover 201, and pivot or slide the wafer cover 201 in place on the receiving tray 202.

In some embodiments, the receiving tray 202 may include a plurality of recesses 212, a plurality of different gridlines 206, notches 2A, and alignment marks 206 for receiving a plurality of semiconductor wafers 241. For example, each cut-out 204 may be used to align and rotate one semiconductor wafer 241 where each one of a plurality of notches 2A and alignment marks 206 are formed in one quadrant of the receiving tray 202 for aligning and rotating the corresponding semiconductor wafer 241. Moreover, the wafer cover 201 may include a plurality of gridlines 205 and reticles 207 divided by each quadrant of the receiving tray 202 such that multiple semiconductor wafers 241 may be simultaneously aligned and marked.

Again, a textured surface feature 213 may be formed along the perimeter of the upper surface 233 of wafer cover 201 and/or a second textured surface feature 211 may be formed along the perimeter of the lower surface 231 of wafer cover 201 to facilitate ease in gripping or rotating the wafer cover 201. The first and second textured surface features 213, 211 may be one or more regions along the perimeter of the upper and lower surfaces 233, 231, respectively, that may be grated, patterned, unpolished, rough, raised, or slanted. The first and second textured surface features 213, 211 may be distributed on the upper and lower surfaces 233, 231, respectively, along one or more curved portions of the perimeter of the upper and lower surfaces 233, 231, respectively of wafer cover 201. In some embodiments, the first and second textured surface features 213, 211 may completely cover the perimeter of upper and lower surfaces 233, 231, respectively of the wafer cover 201.

Figure 2C:
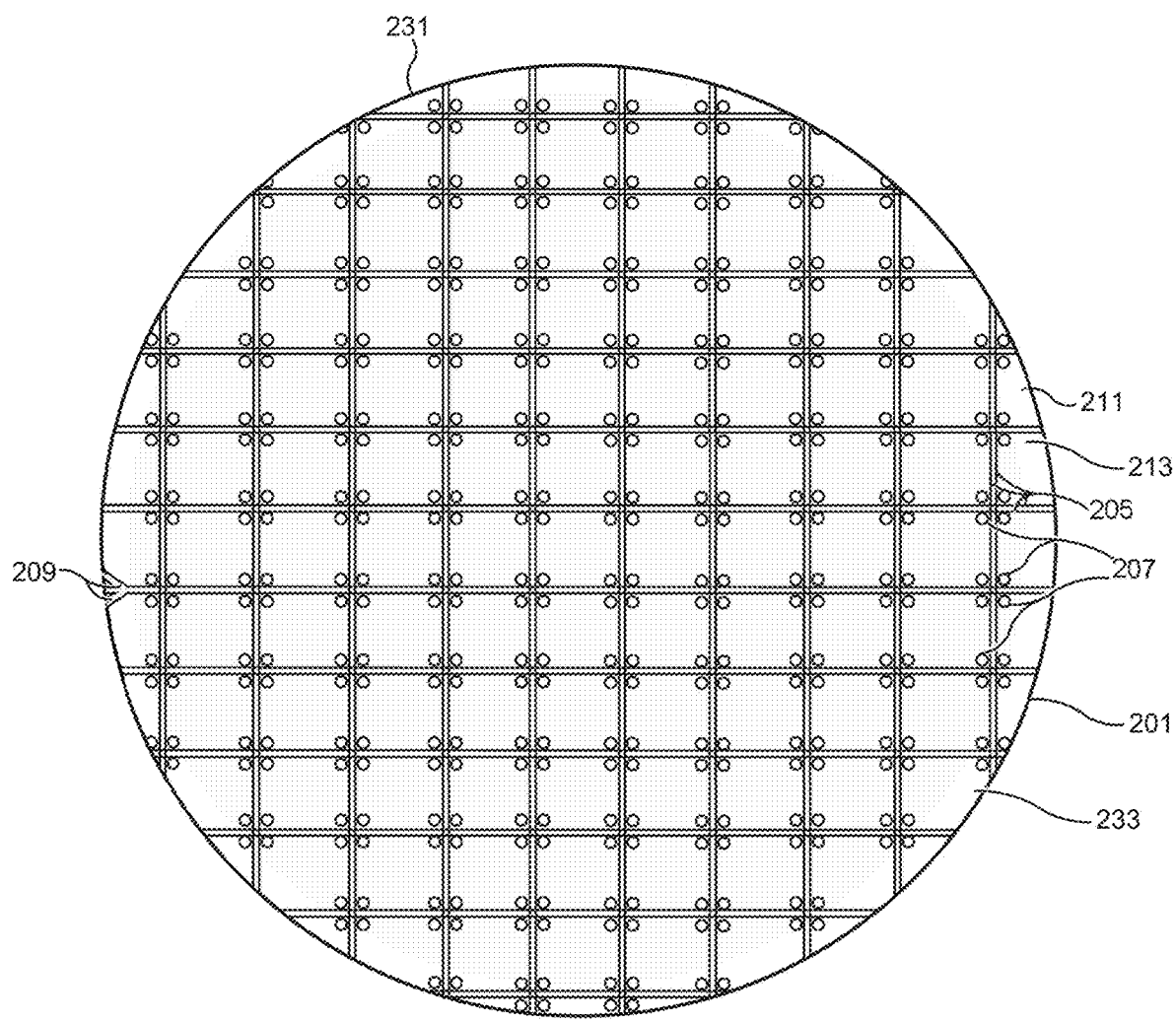
FIG. 2C is a plan view of an exemplary reticle template wafer cover for covering a wafer carrier in accordance with an exemplary embodiment of the present disclosure.

FIG. 2C is a plan view of an exemplary reticle template wafer cover for covering a wafer carrier in accordance with an exemplary embodiment of the present disclosure. As can be seen with reference to FIGS. 2C-2D, an exemplary wafer cover 201 includes one or more grids or gridlines 205 and one or more reticles 207 formed on the upper surface 233. The reticles 207 may be grouped and centered about each intersection of the gridlines 205. The gridlines 205 indicate the field areas 243 of the semiconductor wafer 241, and the reticles 207 may be used to mark, label, or otherwise indicate a field area of interest on the semiconductor wafer 241.

The receiving tray 202 and wafer cover 201 each include a portion of a notch 2A that may be used to align wafer cover 201 with receiving tray 202. In some embodiments, the receiving tray 202 includes a lower portion 210 and the wafer cover 201 includes an upper portion 209. When the lower portion 210 and upper portion 209 are aligned, the gridlines 206 and 208 of the receiving tray 202 and wafer cover 201 are also aligned. The notch 2A may be used to align the semiconductor wafer 241 with the wafer cover 201 by aligning notch 218 of semiconductor wafer 241 with notch 2A. In other embodiments, notch 2A may comprise of one portion formed only on the wafer cover for aligning notch 218 of semiconductor wafer 241 with notch 2A.

The wafer cover 201 may include a textured surface feature 213 along the circumference of an upper surface 233 to facilitate ease in gripping or rotating the wafer cover 201. The textured surface feature 213 may be one or more regions along the circumference of the upper surface 233 that is grated, patterned, unpolished, rough, raised, or slanted. The textured surface feature 213 may be distributed on the upper surface 233 along one or more curved portions of the circumference of the wafer cover 201. In some embodiments, the textured surface feature 213 may completely cover the circumference of the wafer cover 201.

The wafer cover 201 may include a second textured surface feature 211 along the circumference of the lower surface 231 to facilitate ease in gripping or rotating the wafer cover 201. The second textured surface feature 211 may be one or more regions along the circumference of the lower surface 231 that is grated, patterned, unpolished, rough, raised, or slanted. The second textured surface feature 211 may be distributed on the lower surface 231 along one or more curved portions of the circumference of the wafer cover 201. In some embodiments, the second textured surface feature 211 may completely cover the circumference of the wafer cover 201.

Figure 2D:
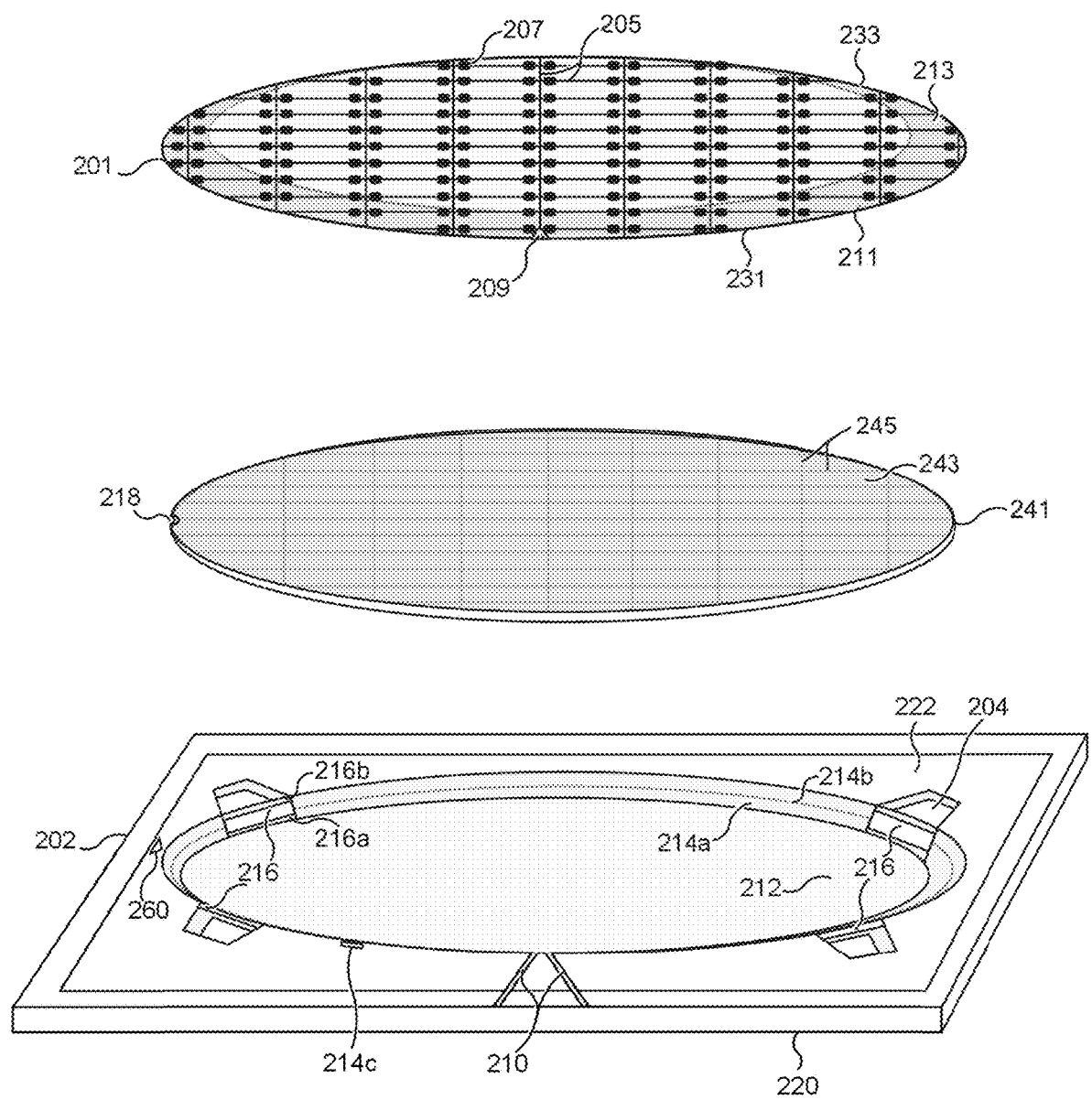
FIG. 2D is a perspective and simplified schematic cross-sectional view of the exemplary reticle template wafer cover of FIG. 2C for use with an exemplary wafer carrier and a semiconductor wafer in accordance with an exemplary embodiment of the present disclosure.

FIG. 2D is a perspective and simplified schematic cross-sectional view of the exemplary reticle template wafer cover of FIG. 2C for use with an exemplary wafer carrier and a semiconductor wafer in accordance with an exemplary embodiment of the present disclosure. As can be seen with reference to FIG. 2D, an exemplary semiconductor wafer 241 includes a plurality of field areas 243, each field area 243 have a plurality of field boundaries 245. The gridlines 205 and reticles 207 align with the field areas 243 and field boundaries 245 of the semiconductor wafer 241. The semiconductor wafer 241 may further include a notch 218 or flat cut (not shown). The receiving tray 202 may further include an alignment mark 260 formed on the top surface 222 of the receiving tray 202 and adjacent to the circumference of recess 212. The alignment mark 260 may be used to align the notch 218 or flat cut of the semiconductor wafer 241, and upper portion 209 and lower portion 210 of notch 2A may then be used to align the gridlines 205 of wafer cover 201 with the field areas 243 and field boundaries 245 of semiconductor wafer 241. In the case of a flat cut semiconductor wafer 241, additional alignment marks 260 may be formed at opposite sides of the circumference of the recess 212 to align the semiconductor wafer 241.

Once the semiconductor wafer 241 is placed in the receiving tray 202, edges of the semiconductor wafer 241 are accessible through one or more cut-outs 204 of the receiving tray 202. Each cut-out 204 includes a window 216 for accessing an edge of the semiconductor wafer 241 and/or the lower surface 231 (or second textured surface 211) of wafer cover 201. Each window 216 may include a lower frame 216a and an upper frame 216b. In some embodiments, each window may have only a lower frame 216a, an upper frame 216b, or no frame. The semiconductor wafer 241 may be rotated by pressing or swiping an exposed edge of the semiconductor wafer 241 within the cut-out 204. The cut-out 204 may also be used to lift the semiconductor wafer 241, and pivot or slide the semiconductor wafer 241 in place over the recess 212. Similarly, the wafer cover 201 may be rotated by pressing or swiping an exposed edge of the wafer cover 201 within the cut-out 204. The cut-out 204 may also be used to lift the wafer cover 201, and pivot or slide the wafer cover 201 in place on the receiving tray 202.

In some embodiments, the receiving tray 202 may include a plurality of recesses 212, a plurality of different gridlines 206, notches 2A, and alignment marks 206 for receiving a plurality of semiconductor wafers 241. For example, each cut-out 204 may be used to align and rotate one semiconductor wafer 241 where each one of a plurality of notches 2A and alignment marks 206 are formed in one quadrant of the receiving tray 202 for aligning and rotating the corresponding semiconductor wafer 241. Moreover, the wafer cover 201 may include a plurality of gridlines 205 and reticles 207 divided by each quadrant of the receiving tray 202 such that multiple semiconductor wafers 241 may be simultaneously aligned and marked.

Again, a textured surface feature 213 may be formed along the circumference of the upper surface 233 of wafer cover 201 and/or a second textured surface feature 211 may be formed along the circumference of the lower surface 231 of wafer cover 201 to facilitate ease in gripping or rotating the wafer cover 201. The first and second textured surface features 213, 211 may be one or more regions along the circumference of the upper and lower surfaces 233, 231, respectively, that may be grated, patterned, unpolished, rough, raised, or slanted. The first and second textured surface features 213, 211 may be distributed on the upper and lower surfaces 233, 231, respectively, along one or more curved portions of the circumference of the upper and lower surfaces 233, 231, respectively of wafer cover 201. In some embodiments, the first and second textured surface features 213, 211 may completely cover the circumference of upper and lower surfaces 233, 231, respectively of the wafer cover 201.

Figure 3A:
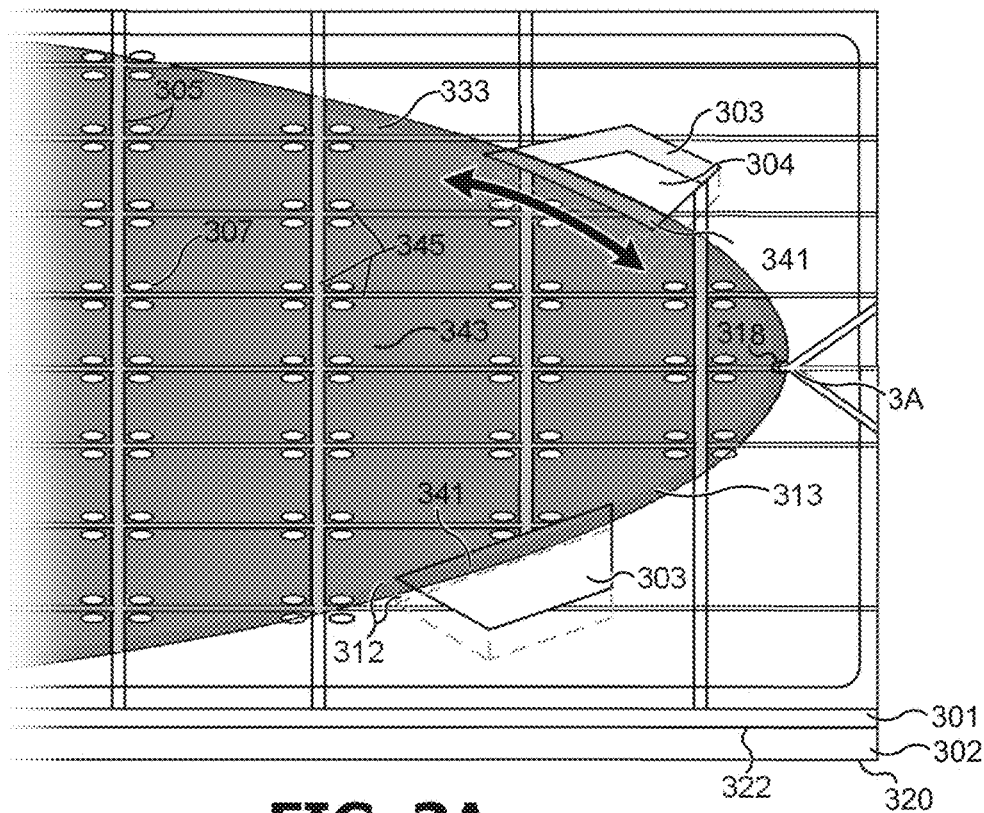
FIG. 3A is a perspective and simplified schematic cross-sectional view of a semiconductor wafer placed between the exemplary reticle template wafer cover and carrier of FIGS. 2A-2B in accordance with an exemplary embodiment of the present disclosure.

FIG. 3A is a perspective and simplified schematic cross-sectional view of a semiconductor wafer placed between the exemplary reticle template wafer cover and carrier of FIGS. 2A-2B in accordance with an exemplary embodiment of the present disclosure. As can be seen with reference to FIG. 3A, the wafer cover 301 may be the same size or slightly larger than the receiving tray 302 to fit over or snap onto the receiving tray 302 to facilitate quick assembly. Further, the wafer cover 301 may include additional cut-outs 303 at each corner of the wafer cover 301 to facilitate correct attachment to the receiving tray 302 at any 90° rotation. Once the semiconductor wafer 341 is placed in recess 312, the notch 3A of the wafer cover 301 may be aligned with semiconductor wafer alignment mark 318 using one or more cut-outs 303 and 304 to access and rotate the semiconductor wafer 341. When cut-outs 303 of the wafer cover 301 align with cut-outs 304 of the receiving tray 302, an edge of the semiconductor wafer 341 can be accessed to rotate, lift, move or otherwise position the semiconductor wafer 341 to align field areas 343 and field lines 345 of semiconductor wafer 341 with reticles 307 and gridlines 305 of the wafer cover 301. As discussed above, the wafer cover 301 may include one or more aligning features (e.g., marks, indentations, lines, etc.). Any combination of alignment mark 318, notch 3A, or gridlines 305 and reticles 307 of wafer cover 301 may be used to align field areas 343 and field boundaries 345 of semiconductor wafer 341 with the gridlines 305 and reticles 307 of wafer cover 301.

Figure 3B:
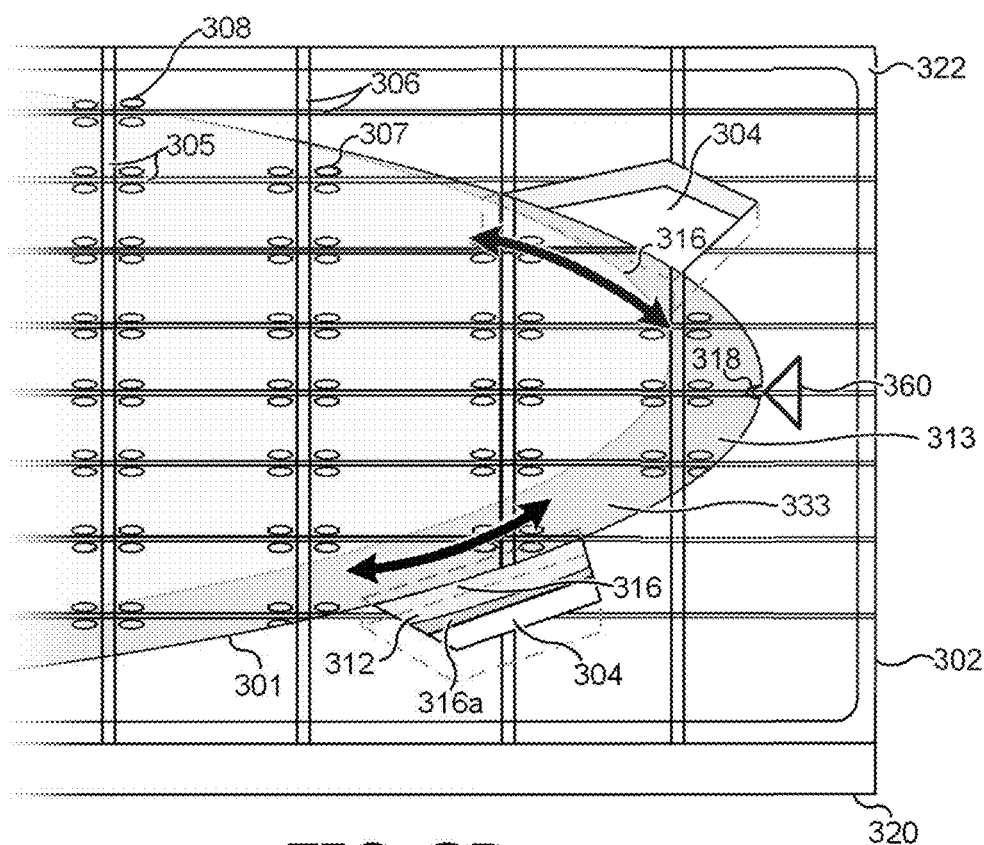
FIG. 3B is a perspective and simplified schematic cross-sectional view of the exemplary reticle template wafer cover and carrier of FIGS. 2C-2D in accordance with an exemplary embodiment of the present disclosure.

FIG. 3B is a perspective and simplified schematic cross-sectional view of the exemplary reticle template wafer cover and carrier of FIGS. 2C-2D in accordance with an exemplary embodiment of the present disclosure. As can be seen with reference to FIG. 3B, an exemplary wafer cover 301 is placed over the top surface 322 of the receiving tray 302 to cover a lip of each cut-out 304. Each cut-out 304 may include a window 316 that extends past the circumference of the wafer cover 301 to allow access to both the first and second textured surface features 313, 311 formed along the circumference of the upper and lower surfaces 333, 331, respectively. In some embodiments, the window 316 may include lower frame 316a or no frame. For example, the lower right window 316 may include lower frame 316a, while the upper right window may have no frame. The window 316 may include upper and lower frames to further protect against contamination or damage to the semiconductor wafer 341. The wafer cover 301 may be the same size, larger, or smaller than the semiconductor wafer 341 to facilitate easier rotation of wafer cover 301 or semiconductor wafer 341.

The wafer cover 301 includes gridlines 305 and reticles 307 that may be used to align with the field areas 343 and field boundaries 345 of semiconductor wafer 241. The exemplary receiving tray 302 may include gridlines 306 and reticles 308 to provide ease in aligning the gridlines 305 and reticles 307 of wafer cover 301 with the field areas 343 and field boundaries 345 of the semiconductor wafer 341.

Further, the wafer cover 301 may be accessed and rotated using one or more cut-outs 304 to align the gridlines 306 and reticles 308 of receiving tray 302 with the gridlines 305 and reticles 307 of wafer cover 301. In some embodiments, the notch 3A may be used to align the gridlines 305 and reticles 307 of wafer cover 301 with gridlines 306 and reticles 308 of receiving tray 302. As discussed above, the wafer cover 301 may include one or more aligning marks 360 (e.g., indentations, lines, cut-outs, etc.) that may be used separately or together with gridlines 306 and reticles 308 of receiving tray 302 to align the field areas 343 and field boundaries 345 of semiconductor wafer 341 with the gridlines 305 and reticles 307 of wafer cover 301. Any combination of alignment mark 318, notch 3A, alignment marks 360, or gridlines 306 and reticles 308 of receiving tray 302 may be used to align field areas 343 and field lines 345 of semiconductor wafer 341 with reticles 307 and gridlines 305 of the wafer cover 301.

Examples of material which could be used in the making wafer cover 301 and receiving carrier 302 may include, for example, one of polyvinyl chloride (PVC), plastic, polymers, or a combination thereof. Any convenient deposition method may be used for forming the wafer cover 301 and receiving carrier 302, including spin coating, chemical vapor deposition (CVD), atomic layer deposition (ALD), vapor deposition polymerization (VDP), or physical vapor deposition (PVD).

Figure 4:
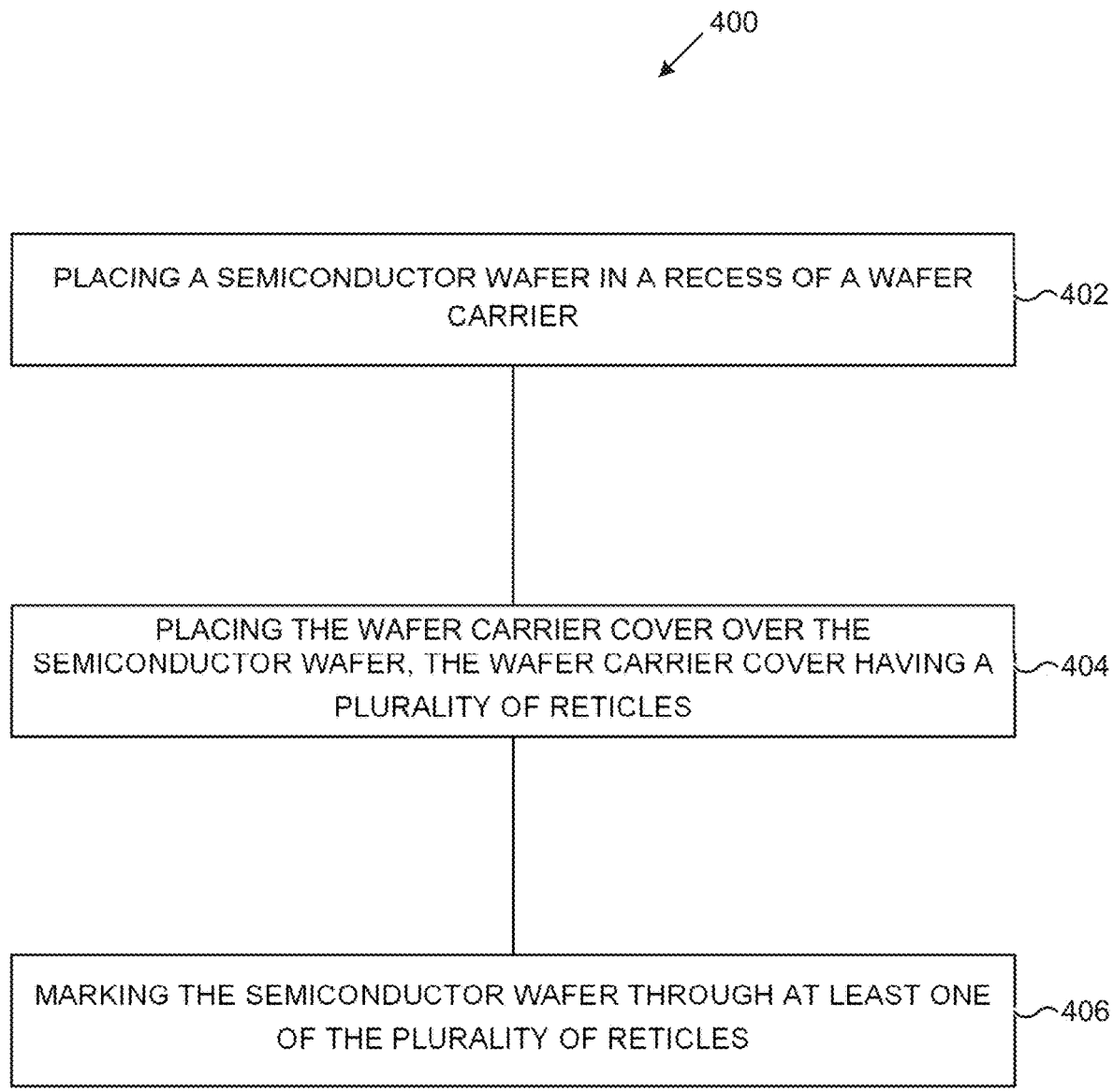
FIG. 4 is a flow chart illustrating an exemplary method of making a semiconductor device assembly in accordance with an exemplary embodiment of the present disclosure.

FIG. 4 is a flow chart illustrating an exemplary method of marking a semiconductor wafer placed in a wafer carrier having a wafer carrier cover. The exemplary method is provided by way of example, as there are a variety of ways to carry out the method. Each box shown in FIG. 4 represents one or more processes, methods or subroutines, carried out in the exemplary method. FIGS. 1, 2A-2D, and 3A-3B show exemplary embodiments of carrying out the method of FIG. 4. The exemplary method may begin at box 402. Further for explanatory purposes, the boxes of the example process 400 are described herein as occurring in serial, or linearly. However, multiple boxes of the example process 400 may occur in parallel. In addition, the boxes of the example process 400 may be performed a different order than the order shown and/or one or more of the boxes of the example process 400 may not be performed.

The exemplary method of FIG. 4 includes placing the semiconductor wafer in a recess of the wafer carrier (box 402).

The method further includes placing the wafer carrier cover over the semiconductor wafer (box 404). In some embodiments, the wafer carrier cover includes a plurality of reticles of the same dimension. In some embodiments, the one or more of the plurality of reticles may have a different shape or dimension.

The method further includes marking the semiconductor wafer through at least one of the plurality of reticles (box 406). In some embodiments, the plurality of reticles on the wafer carrier cover correspond to field areas for photolithography on the semiconductor wafer.

In some embodiments, the wafer carrier may include at least one cut-out formed adjacent to the recess of the wafer carrier, wherein an edge of the semiconductor wafer protrudes from the recess into a portion of the cut-out. In some embodiments, the cut-outs may be used to rotate the semiconductor wafer to access the edge of the semiconductor wafer and rotating the semiconductor wafer.

The method may further include performing one or more photolithographic processes to the semiconductor wafer based on the markings on the semiconductor wafer. In some embodiments, the wafer carrier cover and wafer carrier comprise polyvinyl chloride (PVC), plastic, polymers, or a combination thereof. In some embodiments, the photolithographic process includes exposure of the semiconductor wafer.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the present disclosure have been described herein for purposes of illustration, but that various modifications may be made without deviating from the scope of the present disclosure. Rather, in the foregoing description, numerous specific details are discussed to provide a thorough and enabling description for embodiments of the present disclosure. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the present disclosure. In general, it should be understood that various other devices, systems, and methods in addition to those specific embodiments disclosed herein may be within the scope of the present disclosure.

What is claimed:

1. A wafer carrier assembly comprising:
   a wafer carrier having a first side and a second side opposite the first side, the wafer carrier including, on the first side:
   a circular recess configured to receive a semiconductor device wafer, and
   at least one cut-out arranged along the circumference of the circular recess; and
   a carrier cover having a top side and a bottom side opposite the top side, the carrier cover including, on the top side:
   a plurality of gridlines, the plurality of gridlines extending to edges of the carrier cover, and
   a plurality of reticle openings disposed outside the plurality of gridlines and extending through the carrier cover from the top side to the bottom side, respective subsets of the plurality of reticle openings arranged to have a respective common center, wherein a respective subset of the plurality of reticle openings is arranged at each intersection of the plurality of gridlines such that the respective common center of the respective subset of the plurality of reticle openings corresponds to a respective intersection of the plurality of gridlines.

2. The wafer carrier assembly of claim 1, further comprising:
   a mark having a first portion and a second portion, wherein the first portion of the mark is formed on the first side of the wafer carrier, and the second portion of the mark is formed on the top side of the carrier cover;
   wherein when the first and second portions of the mark are aligned, the plurality of gridlines align with edges of the wafer carrier.

3. The wafer carrier assembly of claim 1, wherein the carrier cover is circular and can freely rotate when placed over the circular recess.

4. The wafer carrier assembly of claim 1, further comprising a cavity defined between the bottom side of the carrier cover and the second side of the wafer carrier, the cavity including a depth greater than a thickness of the semiconductor device wafer.

5. The wafer carrier assembly of claim 4, wherein the semiconductor device wafer is free to rotate when placed within the cavity.

6. The wafer carrier assembly of claim 1, wherein the at least one cut-out is arranged proximate a corner of the wafer carrier.

7. The wafer carrier assembly of claim 1, wherein at least one of the respective subsets of the plurality of reticle openings comprises four reticle openings, each of the four reticle openings located in a different quadrant of the respective intersection of the plurality of gridlines.

8. The wafer carrier assembly of claim 1, wherein the plurality of gridlines on the wafer cover correspond to field areas for photolithography on the semiconductor device wafer.

9. The wafer carrier assembly of claim 1, wherein the wafer carrier and carrier cover comprise polyvinyl chloride (PVC), plastic, polymers, or a combination thereof.

10. The wafer carrier assembly of claim 1, wherein the wafer carrier and the carrier cover are transparent.

11. A wafer carrier cover comprising:
    a circular plate having a top side and a bottom side opposite the top side, the circular plate including, on the top side:
    a plurality of gridlines, the plurality of gridlines extending to the edges of the circular plate, and
    a plurality of reticle openings disposed outside the plurality of gridlines, respective subsets of the plurality of reticle openings arranged to have a respective common center, wherein a respective subset of the plurality of reticle openings is arranged at each intersection of the plurality of gridlines such that the respective common center of the respective subset of the plurality of reticle openings corresponds to a respective intersection of the plurality of gridlines.

12. The wafer carrier cover of claim 11, wherein the plurality of gridlines on the wafer cover correspond to field areas for photolithography on a semiconductor device wafer.

13. The wafer carrier cover of claim 11, wherein the circular plate comprises polyvinyl chloride (PVC), plastic, polymers, or a combination thereof.

14. The wafer carrier cover of claim 11, wherein the circular plate is transparent.

15. The wafer carrier cover of claim 11, further comprising:
    an alignment mark formed on the top side of the circular plate.

16. A method of marking a semiconductor wafer placed in a wafer carrier having a wafer carrier cover, comprising:
    placing the semiconductor wafer in a recess of the wafer carrier;
    placing the wafer carrier cover over the semiconductor wafer, wherein the wafer carrier cover includes: a plurality of gridlines extending to the edges of the circular plate and a plurality of reticle openings disposed outside the plurality of gridlines, respective subsets of the plurality of reticle openings arranged to have a respective common center, wherein a respective subset of the plurality of reticle openings is arranged at each intersection of the plurality of gridlines such that the respective common center of the respective subset of the plurality of reticle openings corresponds to a respective intersection of the plurality of gridlines; and
    marking the semiconductor wafer through at least one of the plurality of reticles.

17. The method of claim 16, wherein the wafer carrier includes at least one cut-out formed adjacent to the recess of the wafer carrier, wherein an edge of the semiconductor wafer protrudes from the recess into a portion of the cut-out.

18. The method of claim 17, further comprising rotating the semiconductor wafer by using the cut-out to access the edge of the semiconductor wafer and rotating the semiconductor wafer.

19. The method of claim 16, wherein the plurality of reticle openings on the wafer carrier cover correspond to field areas for photolithography on the semiconductor wafer.

20. The method of claim 16, wherein the wafer carrier cover and wafer carrier comprise polyvinyl chloride (PVC), plastic, polymers, or a combination thereof.

21. The method of claim 16, further comprising performing one or more photolithographic processes to the semiconductor wafer based on the markings on the semiconductor wafer.

22. The method of claim 21, wherein the photolithographic process includes exposure of the semiconductor wafer.

* * * * *